United States Patent
Khaladkar et al.

(10) Patent No.: US 9,953,103 B2
(45) Date of Patent: Apr. 24, 2018

(54) CLIENT PROCESSING FOR BINARY XML IN A DATABASE SYSTEM

(75) Inventors: Bhushan Khaladkar, Mountain View, CA (US); Sivasankaran Chandrasekar, Palo Alto, CA (US); Ravi Murthy, Fremont, CA (US); Nipun Agarwal, Santa Clara, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 1109 days.

(21) Appl. No.: 11/601,118

(22) Filed: Nov. 16, 2006

(65) Prior Publication Data

US 2007/0208752 A1 Sep. 6, 2007

(51) Int. Cl.
  *G06F 17/30* (2006.01)
  *G06F 17/22* (2006.01)
  *H03M 7/30* (2006.01)

(52) U.S. Cl.
  CPC .... *G06F 17/30914* (2013.01); *G06F 17/2217* (2013.01); *H03M 7/30* (2013.01)

(58) Field of Classification Search
  None
  See application file for complete search history.

(56) References Cited

U.S. PATENT DOCUMENTS

| | | | |
|---|---|---|---|
| 5,780,830 A | 7/1998 | Boie et al. | |
| 5,991,713 A | 11/1999 | Unger et al. | |
| 6,018,747 A | 1/2000 | Burns et al. | |
| 6,414,610 B1 * | 7/2002 | Smith | 341/106 |
| 6,598,055 B1 | 7/2003 | Keesey et al. | |
| 6,883,137 B1 * | 4/2005 | Girardot et al. | 715/242 |
| 6,966,029 B1 | 11/2005 | Ahern | |
| 7,013,425 B2 * | 3/2006 | Kataoka | 715/242 |
| 7,080,094 B2 | 7/2006 | Dapp et al. | |
| 7,143,397 B2 | 11/2006 | Imaura | |
| 7,318,194 B2 | 1/2008 | Achilles et al. | |
| 7,441,185 B2 | 10/2008 | Coulson et al. | |
| 7,500,017 B2 | 3/2009 | Cseri et al. | |
| 7,627,589 B2 * | 12/2009 | Cheslow | |

(Continued)

FOREIGN PATENT DOCUMENTS

| | | |
|---|---|---|
| WO | WO 03107576 | 12/2003 |
| WO | WO 2006026534 | 3/2006 |

OTHER PUBLICATIONS

"EE XML/Binary CFI File Handling Library User Manual" downloaded from the Internet <http://www.smos.esa.int/BinaryXML/SO-UM-DME-LIPP-0005-BINXML-FH-SUM-E2-RO.pdf > 49 pages.

(Continued)

*Primary Examiner* — Charles D Adams
(74) *Attorney, Agent, or Firm* — Hickman Palermo Becker Bingham LLP

(57) ABSTRACT

Techniques are provided for encoding/decoding binary XML data in a client program before sending/receiving the XML to/from a database server. By encoding the binary XML at the client, the overhead of parsing the XML text is avoided by the database server, thus improving database server scalability. Also, the XML data is sent by the server to the client in the binary form, and the binary format is decoded by the client program to perform the necessary operations.

26 Claims, 5 Drawing Sheets

(56) References Cited

U.S. PATENT DOCUMENTS

| | | | |
|---|---|---|---|
| 7,647,552 B2* | 1/2010 | Wan | H04L 29/06 709/203 |
| 2003/0093626 A1* | 5/2003 | Fister | 711/147 |
| 2003/0154308 A1* | 8/2003 | Tang | H04L 29/06 709/247 |
| 2004/0068509 A1 | 4/2004 | Garden et al. | |
| 2004/0068696 A1 | 4/2004 | Seyrat et al. | |
| 2004/0143791 A1 | 7/2004 | Ito et al. | |
| 2004/0186841 A1* | 9/2004 | Heuer et al. | 707/100 |
| 2004/0268305 A1 | 12/2004 | Hogg et al. | |
| 2005/0014494 A1* | 1/2005 | Owen et al. | 455/419 |
| 2005/0033733 A1 | 2/2005 | Shadmon et al. | |
| 2005/0050054 A1* | 3/2005 | Clark et al. | 707/100 |
| 2005/0278289 A1 | 12/2005 | Gauweiler et al. | |
| 2005/0278616 A1 | 12/2005 | Eller | |
| 2006/0021246 A1 | 2/2006 | Schulze et al. | |
| 2006/0168513 A1* | 7/2006 | Coulson et al. | 715/513 |
| 2006/0235868 A1 | 10/2006 | Achilles et al. | |
| 2006/0277179 A1* | 12/2006 | Bailey | 707/7 |
| 2007/0044012 A1 | 2/2007 | Suver et al. | |
| 2007/0271305 A1 | 11/2007 | Chandrasekar et al. | |
| 2008/0077606 A1 | 3/2008 | Fang et al. | |
| 2008/0098001 A1 | 4/2008 | Gupta et al. | |
| 2008/0098019 A1 | 4/2008 | Sthanikam et al. | |
| 2008/0098020 A1 | 4/2008 | Gupta et al. | |
| 2015/0199414 A1* | 7/2015 | Braginsky | G06F 17/30132 707/613 |

OTHER PUBLICATIONS

"Binary XML Library" downloaded from the Internet Aug. 6, 2007 <http://www.smos.esa.int/BinaryXML/> 2 pages.

"Zapthink" downloaded from the Internet Aug. 6, 2007 < http://www.zapthink.com/report.html?id=ZAPFLASH-11162004 > 3 pages.

Bayardo et al., "An Evaluation of Binary XML Encoding Optimizations for Fast Stream Based XML Processing" *WWW2004* 10 pages.

Bruce, "CubeWerx Position Paper for Binary XML Encoding" (10 pages).

Martin et al., "WAP Binary XML Content Format" downloaded from the Internet Aug. 6, 2007 < http://www.w3.org/TR/wbxml/ > 15 pages.

Bayardo et al., "Optimizing encoding: An evaluation of binary xml encoding optimizations for fast stream based xml processing", May 2004, Proceedings of the 13th international conference on World Wide Web WWW 04', Publisher ACM press, 7 pages.

Liu et al., "XML retrieval: Configurable indexing and ranking for XML information retrieval", Jul. 2004, Proceedings of the 27th annual international ACM SIGIR conference on Research and development in information retrieval SIGIR 04', Pulished by ACM press, 12 pages.

Liefke et al., "Xmill: an efficient compressor for XML data", May 2000, ACM SIGMOD Record, Proceedings of the 2000 ACM SIGMOD international conference on Management of data SIGMOD 00', vol. 29 Issue 2, Publisher: ACM Press, 12 pages.

Min et al., "XML Indexing and compression: XPRESS: a queriable compression for XML data", Jun. 2003, Proceedings of the 2003 ACM SIGMOD international conference on Management of data SIGMOD 03', Published by ACM Press, 8 pages.

Zou et al., "XML Processing: Ctree: a compact tree for indexing XML data" Nov. 2004, Proceedings of the 6th annual international workshop on Web information and data management WIDM 04', Published by ACM Press, 10 pages.

PCT/US2007/010163, Notification of Transmittal of the International Search Report and the Written Opinion of the International Searching Authority, Oct. 12, 2007, 12 pages.

U.S. Appl. No. 11/743,561, filed May 2, 2007, Restriction Requirement, Apr. 16, 2010.

* cited by examiner

CLIENT PROCESSING FOR BINARY XML IN A DATABASE SYSTEM

FIELD OF THE INVENTION

The invention generally relates to storage of XML in a database system and, more specifically, to efficient client processing for binary XML.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Binary XML

Binary XML is one format in which XML data can be stored in a database. Binary XML is a compact binary representation of XML that was designed to reduce the size of XML documents. One of the ways binary XML compresses data is by representing strings ("tokens") with fixed values.

In one implementation of binary XML, a mapping is established between character strings and replacement values, where the character strings are tag names, and the replacement values are numbers. Such mappings are referred to herein as "translation information".

For example, consider an XML document PO1 that contains the following content:

```
<Purchase Order>
  <body>
    Important Data
  </body>
</Purchase Order>
```

PO1 includes the tokens "Purchase Order" and "body". To store PO1 in binary XML format, the token "Purchase Order" may be mapped to 1, and the token "body" may be mapped to 2. Typically, the replacement values consume much less space than the corresponding tokens. For example, the token "Purchase Order", which contains fourteen characters, may be assigned a binary replacement value that takes less space to store than a single text character.

Once translation information has been created, XML documents may be stored in binary XML based on the translation information. For example, PO1 may be stored as <1><2>Important Data</2></1>. In typical implementations of binary XML, even the symbols (e.g. "<", ">", and "/") may be represented by binary replacement values.

TRANSLATING BETWEEN BINARY XML AND TEXT

When stored in binary XML, an XML document consumes much less space than is required by other formats of XML storage. However, the space savings is achieved at the cost of additional overhead required to convert textual XML to binary XML, and to convert binary XML to textual XML. For example, to be meaningful to an application that requests PO1, <1><2>Important Data</2></1> would have to be translated back into:

```
<Purchase Order>
  <body>
    Important Data
  </body>
</Purchase Order>
```

In order to reconstruct the text of an XML document that has been stored in binary format, the translation information that was used to encode the XML document must be available. The translation information that is used to store XML data within a database is typically stored separate from the binary XML data itself.

Translation Information

How a database system stores translation information may hinge on whether the translation information is for known-schema XML or for unknown-schema XML. XML data is "known-schema" XML if the database server knows the XML schema to which the XML data conforms. The database server may "know" the schema, for example, if the schema has been registered with the database server.

On the other hand, XML data is "unknown-schema" XML if the database server does not know the schema to which the XML data conforms. Thus, unknown-schema XML includes both (a) XML documents that do not conform to any schema, and (b) XML documents that conform to an XML schema, but the XML schema is not known to the database server.

In some database systems, the translation information for known-schema binary XML is stored on a per-schema basis. Thus, since all documents that conform to a given schema will typically contain the same tag strings, the same translation information is used to encode all of the documents that conform to the given schema.

According to one embodiment, the translation information for known-schema binary XML is stored, in the database, as part of the definition of the schema. Schema definitions, in turn, are stored in a schema table.

In some database systems, the translation information for all unknown-schema binary XML are stored in tables referred to herein as "token tables". In one embodiment, three token tables are used to store the translation information for unknown-schema XML: a Qname token table, a namespace token table, and a path_id token table. The three token tables are collectively referred to as a "token table set".

The Qname token table for an XML schema contains the Qname-to-replacement-value mappings used to encode the Qnames contained in unknown-schema XML. The namespace token table for an XML schema contains the namespace-to-replacement-value mappings used to encode the namespaces contained in unknown-schema XML. The path_id token table for an XML schema contains the path_id-to-replacement-value mappings used to encode the path_ids contained in unknown-schema XML.

Server-Side Translation

Currently, client programs do not understand Binary XML data. Consequently, data is sent from client programs to the database as XML text. Within the database server, the XML text is parsed and encoded to the Binary format. Similarly, when client programs need to read XML data which has been stored in the Binary format, the data is converted to the text on the server and sent over to the client as XML text where it needs to be parsed to be operated upon.

FIG. 1 is a block diagram of a system that uses server-side translation of binary XML. Referring to FIG. 1, a client 102 sends text formatted XML 104 to a database server 106 for storage in a database 110. Upon receiving the textual XML 104 from the client 102, an encoder/decoder 108 within the database server 106 encodes the XML into binary XML 112 based on translation information 116 retrieved from the database 110. Once encoded, the binary XML 112 may be stored in a binary XML repository 114 within the database 110.

The retrieval of binary XML from database 110 works in a similar manner. Specifically, the binary XML is retrieved from the database 110, decoded by the database server 106 using encoder/decoder 108 and translation information 116, and the textual version of the XML is sent back to the client 102.

Unfortunately, sending uncompressed data across the wire from client to server and server to client in this manner requires a significant amount of network bandwidth, which is expensive. In addition, the database server CPU has to spend extra cycles trying to parse the XML text coming from clients, and to print the encoded text to the text format that is sent to clients. The server-side operations adversely affect the scalability of the database server.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

Techniques are provided for encoding binary XML data in a client program before sending the XML to the database server. Because the XML is binary-encoded at the client, the overhead of parsing the XML text is avoided by the database server, thus improving database server scalability. Also, the XML data is sent by the server to the client in the binary form, and the binary format is decoded by the client program to perform the necessary operations.

As used herein, the terms "client" and "client program" refer to any program, other than the database server, in the chain of communication between a database application and the database server. Thus, in one embodiment, the database application itself is the "client" that performs encoding of binary XML that is sent to the database server, and decoding of binary XML that is received from the database server. In another embodiment, the "client" that performs the encoding and decoding of binary XML is a middle-tier layer situated between the database application and the database server. In yet another embodiment, the client that performs the encoding of the binary XML is different from the client that performs the decoding of the binary XML. For example, the database application may perform the text-to-binary encoding, while a middle-tier layer performs the binary-to-text decoding.

Client-Side Translation Architecture

Figure 1:
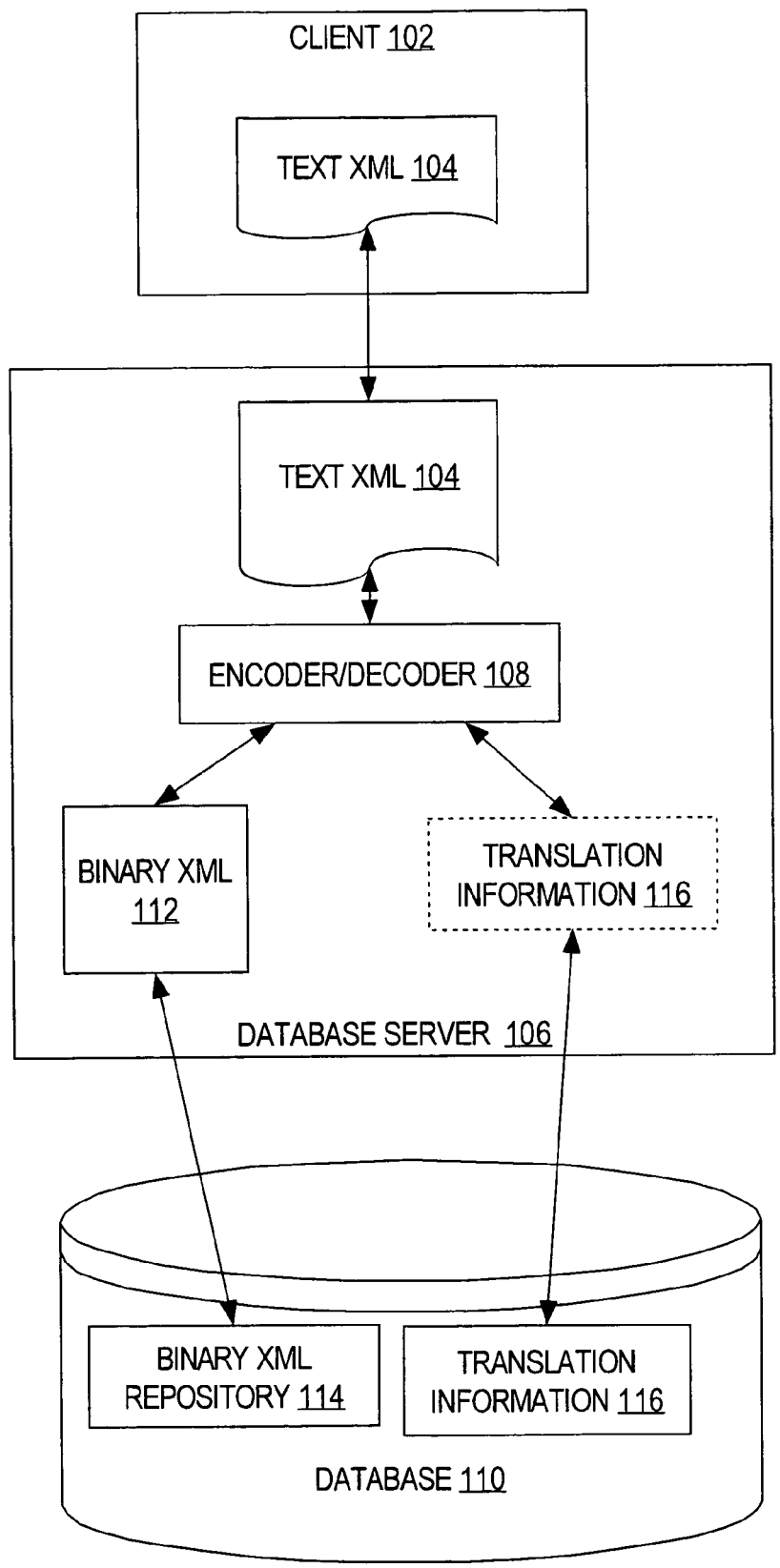
FIG. 1 is a block diagram of a system that uses server-side translation of binary XML.
Figure 2:
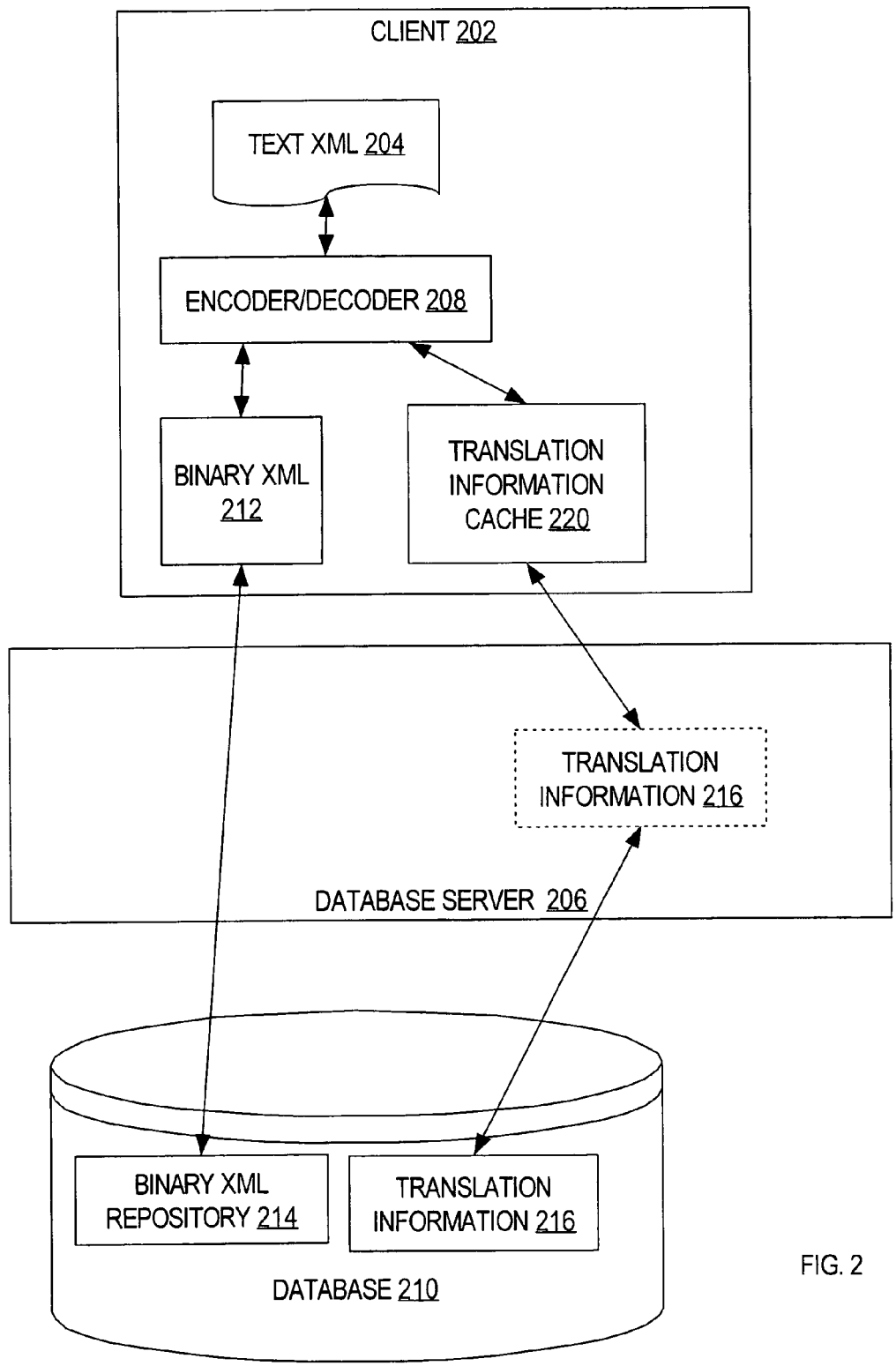
FIG. 2 is a block diagram of a system that uses client-side translation of binary XML, according to an embodiment of the invention.

FIG. 2 is a block diagram of a system that uses client-side translation of binary XML. Referring to FIG. 2, an encoder/decoder 208 within a client 202 encodes textual XML 204 into binary XML 212 based on translation information 216 retrieved from the database 210. Once encoded, the client 202 sends the binary XML 212 to a database server 206 for storage in the database 210.

The retrieval of binary XML from database 210 works in a similar manner. Specifically, the database server 206 retrieves the binary XML 212 from binary XML repository 214 within the database 210, and sends the binary XML 212 to the client 202. Within the client 202, the binary XML is decoded using encoder/decoder 208 and translation information 216, to reconstruct the textual version of the XML inside client 202. In the illustrated embodiment, the client 202 maintains the translation information 216 within a client-side translation information cache 220.

Client-Side Cache of Translation Information

As mentioned above, techniques are described herein for encoding and/or decoding binary XML at a client that is external to the database server, so that (1) less bandwidth is used in the client/server communications, and (2) fewer server-side computational resources are required to support the storage of binary XML. However, to do the encoding or decoding of the data efficiently on the client side, the client has to have the appropriate translation information. Such translation information includes the token-to-replacement-value mappings that are stored in the schema table and/or token tables within the database.

According to one embodiment, when the client needs to encode or decode an XML document, the client 202 obtains the translation information 216 required for the operation from the database 210 by sending a request for the translation information to the database server 206. However, to avoid the need to query the database server 206 every time an XML document needs to be encoded/decoded, in one embodiment the client 202 maintains a cache 220 of the translation information. By maintaining a client-side cache 220 of translation information, the client 202 need only query the database server 206 for translation information 216 if the translation information 216 does not already reside in the cache 220.

In one embodiment, client-side cache 220 is organized based on the namespace associated with the translation information. Thus, when an XML document associated with a particular namespace needs to be encoded or decoded, the client 202 checks cache 220 to see if cache 220 has translation information for that namespace (the "needed translation information"). A special "null namespace" cache entry is maintained for translation information of XML that does not specify a namespace. If cache 220 does not already have the needed translation information, then the needed translation information is retrieved from the database server 206, and stored in the client-side cache 220.

If the needed translation information has to be retrieved from the database server 206 and the cache 220 is already full, then translation information for another namespace (the "old translation information") is replaced with the needed translation information. Various techniques may be used to select the old translation information to replace. For example, the client 202 may select for replacement the translation information for the namespace that has been least recently used by client 202. The least recently used (LRU) cache replacement technique is merely one example of how client 202 may determine which old translation information to replace. The invention is not limited to any particular cache replacement technique.

Namespace and Schema Identification

The namespace and schema of an XML document are typically identified in the text XML document itself. For example, an XML document may have a schemalocation attribute that includes a value string that identifies the schema to which the document conforms. Thus, if the schema of the document belongs to a namespace, then the text XML 204 may include:

<PO xsi:schemalocation="PO.xsd" . . .

On the other hand, if the schema of the document does not belong to a namespace, then the text XML 204 may include:

<PO xsi:nonamespaceschemalocation="PO.xsd" . . .

In both examples, the XML document belongs to the schema indicated by the identifier "PO.xsd". However, in the first example, that schema belongs to a namespace, while in the second example the schema does not.

As mentioned above, XML documents that fail to specify a namespace are treated as belonging to a "null" namespace.

According to one embodiment, client 202 performs binary XML encoding/decoding for both known schema and unknown schema XML. XML documents are treated as known-schema XML if the specified schema for the specified namespace has been registered with database 210. XML documents are treated as unknown-schema XML if the XML documents do not specify a schema, or if the specified schema has not been registered within the specified namespace.

Client-Side Encoding

Figure 3:
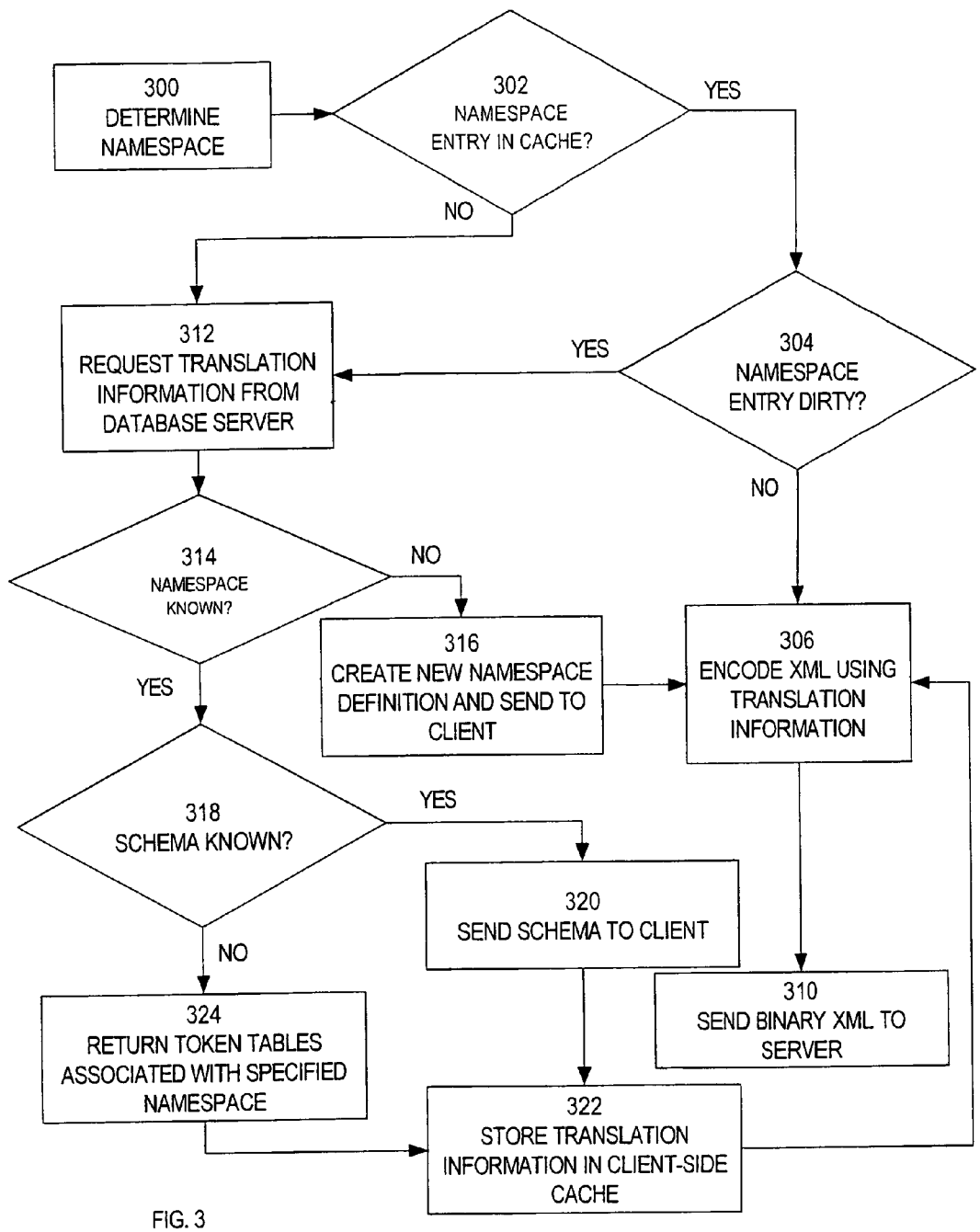
FIG. 3 is a flowchart that illustrates steps for client-side encoding of binary XML, according to an embodiment of the invention.

Referring to FIG. 3, it is a flowchart that illustrates steps for client-side encoding of binary XML, according to an embodiment of the invention. The steps of FIG. 3 will now be described in reference to the system illustrated in FIG. 2.

Referring to FIGS. 2 and 3, client 202 begins the client-side encoding of text XML 204 at step 300 by determining the namespace associated with the text XML 204 that needs to be encoded (the "target namespace"). If no namespace is specified, then the null namespace considered to be the target namespace. Once the target namespace has been identified, the client 202 checks the cache 220 to see if the cache 220 includes an entry for the target namespace (step 302).

If the cache 220 includes an entry for the target namespace, then the client 202 checks to see if the entry for the target namespace has been marked as "dirty" (step 304). The process by which a cache entry becomes "dirty" shall be described in greater detail hereafter.

If the cache entry for the target namespace exists and is not dirty, then at step 306 the encoder/decoder 208 uses the translation information in the cache entry for the target namespace to encode the XML. The binary encoded XML 212 thus produced is sent to database server 206 for storage in database 210 (step 310).

If the cache 220 does not have an entry for the target namespace, or if the namespace entry has been marked dirty, then the client 202 sends a request to database server 206 to fetch the translation information (step 312).

At step 314, the database server 206 determines whether the target namespace is known. If the target namespace is not known, then at step 316 the database server 206 creates a new namespace definition, stores the new namespace definition in the database 210, and sends the new namespace definition to the client 202. In the response to receiving the new namespace definition, the client 202 creates a new entry in cache 220 for the target namespace. Initially, the new namespace entry will have no translation information.

At step 306, the client 202 encodes the text XML into binary XML. During the encoding, the client 202 uses the mapping information contained in the cache 220 for the target namespace. In the case where the database server 206 merely returned a new namespace definition, the cache will initially contain no relevant translation information. However, the cache entry for the target namespace is augmented with new token mappings as new tokens are encountered during the encoding operation. The process of augmenting the translation information during the encoding process shall be described in greater detail hereafter.

If, at step 314, the database server 206 determines that the specified namespace is known, then at step 318 the database server 206 determines whether the schema identified in the client request has been registered relative to the specified namespace. If the specified schema has been registered in the database 210, then the database server 206 responds to the request of client 202 by providing the schema (which includes the necessary translation information) to the client 202 (step 320).

Once the schema is received at the client 202, the translation information from the schema is stored in the cache 220 in an entry associated with the target namespace (step 322). The encoder/decoder 208 uses the translation information to encode the XML (step 306). The binary encoded XML 212 thus produced is sent to database server 206 for storage in database 210 (step 310).

If no schema is found by the database server 206 at step 318, then the database server 206 sends to the client 202 translation information from the token tables associated with target namespace (step 324). At step 322, the client 202 stores the translation information from the token tables in an entry for the target namespace, within the client-side cache 220. The encoder/decoder 208 uses the translation information to encode the XML (step 306). The binary encoded XML 212 thus produced is sent to database server 206 for storage in database 210 (step 310).

Augmenting the Translation Information During Encoding

While client 202 is encoding XML, the client 202 may encounter tokens that are not associated with any token-tovalue mappings contained within the translation information within cache 220. For example, assume that the XML that is being translated belongs to schema PO.xsd within namespace PO. Assume that, for schema PO.xsd within namespace PO, the cache 220 only has token mappings for tokens A, B, and C, where A maps to 1, B maps to 2, and C maps to 3.

Under these circumstances, the encoder/decoder 208 may encounter a token D within the XML that is being encoded. When the XML contains new tokens which are not part of the server token definitions, then the client 202 will be unable to find the definition in its local cache. In this case, the client 202 generates a new token-to-value mapping for the token. For example, upon encountering the token D in the text XML that is being encoded, the client 202 may generate a token-to-value mapping that maps D to 4.

New token-to-value mappings that are generated by the client 202 during an encoding operation are referred to herein as client-generated token mappings. According to one embodiment, client-generated token mappings are stored in the translation information cache 220 and are encoded as part of the binary XML document. Thus, at any given time, the cache 220 may contain token mappings that do not exist in the translation information 216 maintained in the database 210.

When the cache entry for the target namespace is augmented with any client-generated token mappings, the cache entry is marked as "dirty". At the initiation of any subsequent coding or decoding operation, if the cache entry for the namespace involved in the operation is dirty, then the client 202 refreshes the cache entry by retrieving the translation information for the target namespace from the database 210.

Under certain circumstances, the refreshed information retrieved from the database may change some of the token mappings. For example, while the client 202 may have generated a token mapping that mapped token D to 4, the refreshed mapping information from the database 210 may instead map token D to 5. Such mapping changes, where the database server mapping overrides a previous client-generated mapping, may be the result of mapping collisions, which shall be described in greater detail hereafter.

According to one embodiment, client 202 includes all client-generated token-to-value mappings in the binary-encoded XML stream that the client 202 sends to the database server 206. In one embodiment, the client 202 also includes a "new mapping" flag bit that indicates to the database server 206 that the binary XML includes new definitions for the particular namespace.

Mapping Collisions

It is possible for multiple clients to be encoding XML for the same namespace. During the encoding operation, two or more of the clients may encounter a token D for which the database server 206 had not provided a token mapping. Under these circumstances, it is possible for different clients to generate different client-generated token mappings for the same token. For example, consider a situation in which, within the same namespace, a first client maps token D to 4, and a second client maps token D to 5. In this example, both clients will generate binary XML based on their own client-generated token mappings, and send the binary XML to the database server 206.

As the database server 206 receives the binary XML streams from the clients, the database server 206 inspects the new mapping flag bits of the binary XML. In the present example, the new mapping flag bits from both clients would indicate that the binary XML streams include client-generated token mappings. In response to detecting that the new mapping flag bits were set, the database server 206 extracts from the two incoming binary XML streams the client-generated token mappings.

Upon extracting the client-generated token mappings from the binary XML streams, the database server 206 would detect that a mapping collision occurred (i.e. within the same namespace, multiple clients have mapped the same token to different values). According to one embodiment, when a mapping collision occurs, the database server 206 determines which of the competing mappings will be used by the database server 206. In the present example, assume that the database server 206 determines that the D to 4 mapping should be used.

After determining which of the competing mappings to use, the database server 206 stores the chosen mapping in the translation information 216 of the database 210, and remaps any binary XML stream that has not used the chosen mapping. In the present example, the binary XML stream from the first client will not have to be remapped because the mapping generated by the first client was chosen by the database server 206.

On the other hand, the binary XML stream coming from the second client will contain the value 5 in the place of every D token that is in the text XML document that is being encoded by the second client. However, since the D to 4 mapping was chosen by the database server 206, all instances of the value "5" within the binary XML stream coming from the second client are replaced by the database server 206 with the value "4". Thus, as ultimately stored within database 210, all binary XML is encoded in a manner that is consistent with the token mappings maintained by the database server 206.

Client-Side Decoding

Figure 4:
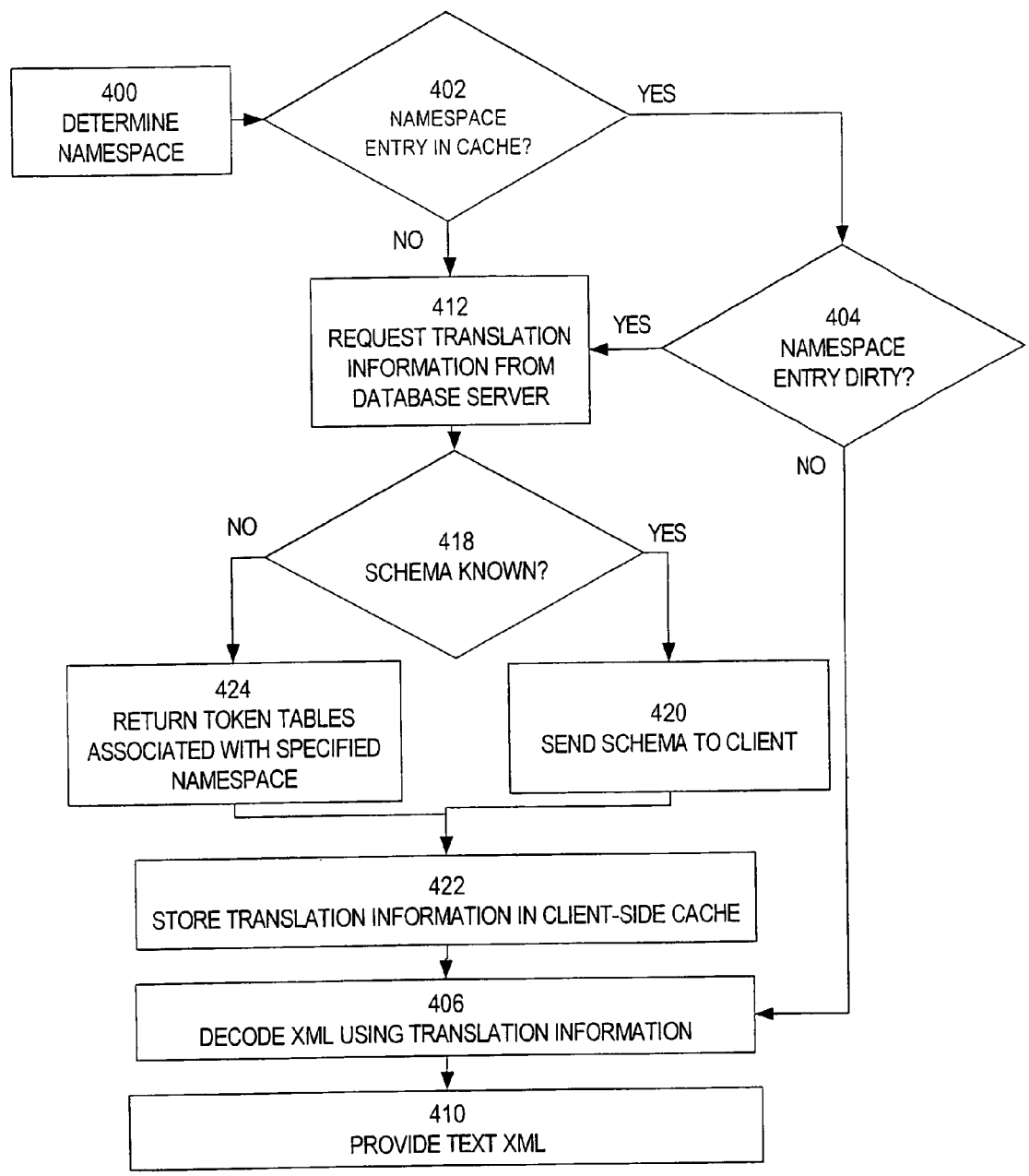
FIG. 4 is a block diagram that illustrates client-side decoding of binary XML, according to an embodiment of the invention.

FIG. 4 is a block diagram that illustrates client-side decoding of binary XML, according to an embodiment of the invention. The steps of FIG. 4 will now be described in reference to the system illustrated in FIG. 2.

Referring to FIGS. 2 and 4, client 202 begins the client-side decoding of binary XML 212 at step 400 by determining the namespace associated with the binary XML 212 that needs to be decoded (the "target namespace"). If no namespace is specified for the binary XML 212, then the null namespace considered to be the target namespace. Once the target namespace has been identified, the client 202 checks the cache 220 to see if the cache 220 includes an entry for the target namespace (step 402).

If the cache 220 includes an entry for the target namespace, then the client 202 checks to see if the entry for the target namespace has been marked as "dirty" (step 404). If the cache entry for the target namespace exists and is not dirty, then at step 406 the encoder/decoder 208 uses the translation information in the cache entry for the target namespace to decode the binary XML 212. The text XML 204 thus produced is available for further processing by the client 202 (step 410). In the case where client 202 is middleware, such further processing may involve sending the text XML 204 to another application, such as a database client.

When a non-dirty version of the translation information is already in the cache 220, it is possible for the binary XML to contain replacement values for which the cached translation information does not have token mappings. This situation may occur, for example, if the database server created new token mappings for the namespace after the translation information for the namespace had been stored in cache 220. When the decoder 208 encounters any replacement values for which the cached translation information does not have token mappings, the client 202 refreshes the cached information by requesting translation information for the target namespace from the database server 206 (step 412).

As illustrated in FIG. 4, step 412 is also performed if the cache 220 does not have an entry for the target namespace, or if the namespace entry has been marked dirty. In response to the request, at step 418 the database server 206 determines whether the binary XML that is being decoded belongs to a known schema. If the binary XML belongs to a known schema, then the database server 206 responds to the request of client 202 by providing the schema (which includes the necessary translation information) to the client 202 (step 420).

Once the schema is received at the client 202, the translation information from the schema is stored in the cache 220 in an entry associated with the target namespace (step 422). The encoder/decoder 208 uses the translation information to decode the binary XML (step 406). The text XML 204 thus produced is made available for further processing within the client (step 410).

If the binary XML does not belong to a known schema, then the database server 206 sends to the client 202 translation information from the token tables associated with target namespace (step 424). At step 422, the client 202 stores the translation information from the token tables in an entry for the target namespace, within the client-side cache 220. The encoder/decoder 208 uses the translation information to decode the XML (step 406). The text XML 204 thus produced is made available for further processing (step 410).

Avoiding Mapping Collisions

In the embodiments described above, clients generate their own token mappings when they encounter previously unknown tokens during an encoding operation. As a consequence, different clients can generate different token mappings for the same token, causing a collision. An embodiment was described above in which such collisions were handled by having the database server choose a mapping, and remapping any binary XML that uses a mapping that is inconsistent with the selected mapping.

In an alternative embodiment, mapping collisions are avoided by having clients request mappings from the database server, whenever they encounter a token for which they do not have a token mapping. In such an embodiment, mapping collisions would not occur, since the database server would communicate consistent mapping information to all clients. However, having clients request token mappings from the server every time they encounter new tokens has the disadvantage of causing more client-to-server communications during encoding operations.

Mixed Client Environments

According to one embodiment, clients that are configured to perform their own encoding/decoding of binary XML, such as client 202, may be used concurrently in a system with clients that are not able to perform their own encoding/decoding of binary XML, such as client 102. Thus, when a database server receives a request from a client, the request indicates whether the client is able to handle its own encoding/decoding. If the client is able to handle the encoding/decoding, then the database server 206 does not decode binary XML before sending the binary XML to the client, or perform any encoding of binary XML received from the client (although the database server may still have to perform some remapping of client-encoded binary XML, as described above). On the other hand, if the client is unable to handle the encoding/decoding, then the database server performs the necessary encoding and decoding, so that the client only has to deal with the text version of the XML.

Hardware Overview

Figure 5:
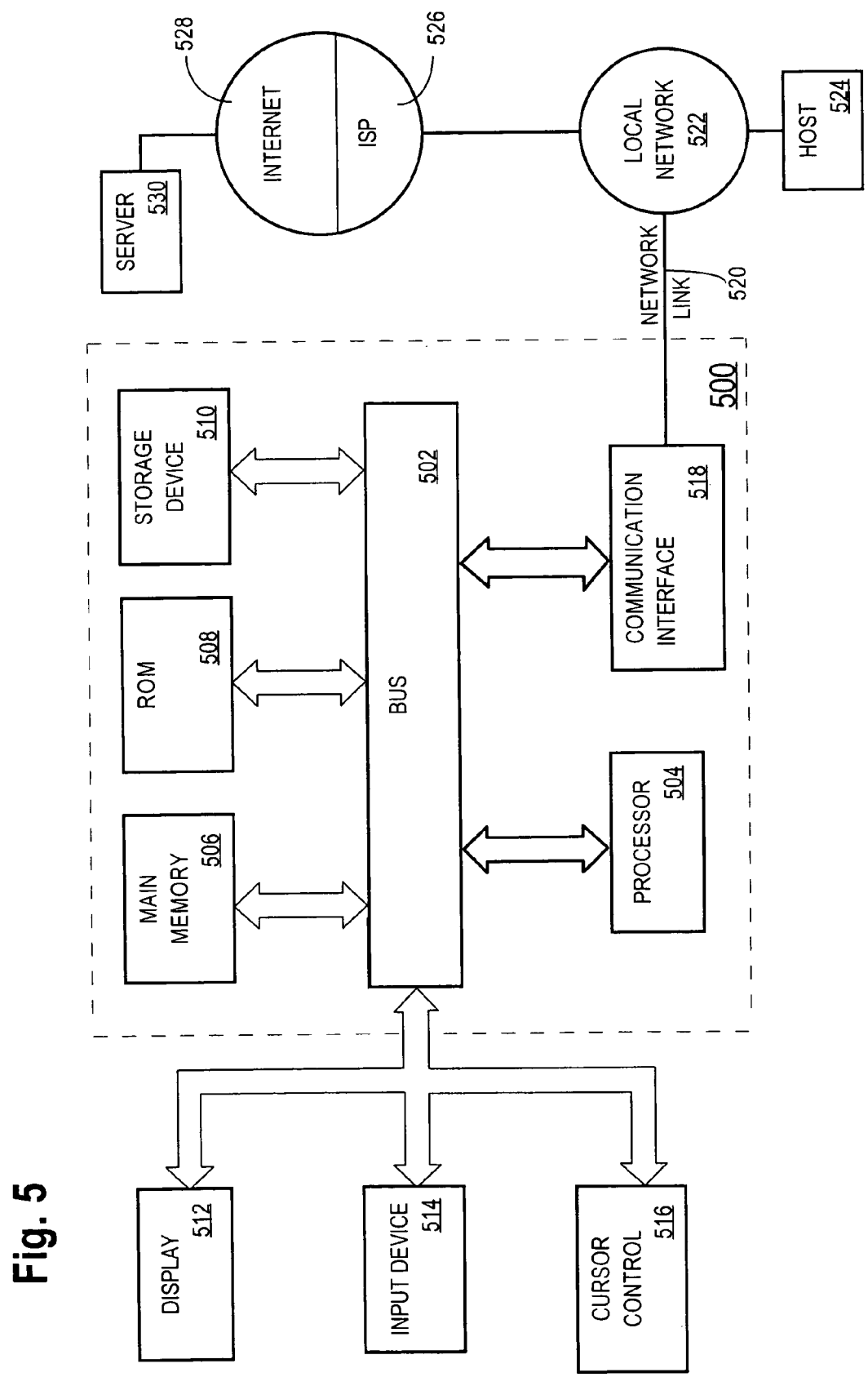
FIG. 5 is a block diagram that illustrates a computer system upon which an embodiment of the invention may be implemented.

FIG. 5 is a block diagram that illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

The invention is related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hardwired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 500, various machine-readable media are involved, for example, in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method comprising:
   receiving, at a client, text XML, data to be stored as binary XML data in a database managed by a server;
   receiving, from the server, translation information for a target namespace, wherein the translation information maps a plurality of strings to a corresponding plurality of binary replacement values;
   wherein the translation information includes information that maps a first string of one or more characters of the text XML data to a first binary replacement value;
   wherein the translation information includes information generated by an entity other than the client;
   producing, at the client, an entire set of encoded binary XML data by encoding the text XML data based, at least in part, on the translation information, for the target namespace, received from the server;
   wherein producing the entire set of encoded binary XML data includes:
      beginning the encoding of the text XML data based on the translation information received from the server;
      wherein beginning the encoding includes identifying an occurrence of the first string in the text XML data, and encoding the occurrence of the first string with the first binary replacement value;
      detecting a second string of one or more characters, in the text XML data, for which no binary replacement value currently exists in the translation information received from the server;
      in response to detecting the second string, performing the steps of:
         generating a client-generated token mapping for the second string, wherein the client-generated token mapping maps the second string to a second binary replacement value; and
         encoding the second string based on the client-generated token mapping;
   providing, from the client to the server:
      the entire set of encoded binary XML data, wherein the entire set of encoded binary XML data is partially encoded according to the client-generated token mapping and partially encoded according to translation information generated by the entity other than the client; and the client-generated token mapping, wherein the client-generated token mapping includes some, but not all, strings and binary replacement values to enable the server to decode the entire set of encoded binary XML data;

wherein the step of producing includes replacing the first string with the first binary replacement value and the second string with the second binary replacement value;

wherein the method is performed by one or more computing devices;

wherein producing the entire set of encoded binary XML data is a first operation of encoding or decoding using the translation information for the target namespace;

maintaining, at the client, a client-side cache that includes a particular cache entry for the target namespace;

wherein the particular cache entry includes the translation information for the target namespace;

in response to generating the client-generated token mapping, setting, as dirty, a dirty flag for the particular cache entry that includes the translation information for the target namespace, and not refreshing the particular cache entry until initiating a second operation of encoding or decoding using translation information for the target namespace;

in response to initiating the second operation of encoding or decoding using translation information for the target namespace, the client performing:

checking the client-side cache for the particular cache entry that includes the translation information for the target namespace;

in response to detecting that the client-side cache includes the particular cache entry, determining whether the dirty flag associated with the particular cache entry is set;

in response to detecting that the dirty flag associated with the particular cache entry is set, refreshing the particular cache entry in the client-side cache by requesting a refreshed version of the translation information for the target namespace from the server; and in response to receiving the refreshed version of the translation information from the server, storing the refreshed version of the translation information in the client-side cache.

2. The method of claim 1, wherein the step of checking the client-side cache for the particular cache entry that includes the translation information for the target namespace includes:

determining the target namespace associated with a second set of XML data used in the second operation; and determining whether the client-side cache includes token mappings for said target namespace.

3. The method of claim 1, wherein the server is a database server, and wherein the client is a middleware layer in a communication path between a database client and the database server.

4. The method of claim 1, wherein each binary replacement value of the first binary replacement value and the second binary replacement value takes less space to store than a single text character.

5. The method of claim 1, further comprising: providing, with the entire set of encoded binary XML data and the client-generated token mapping, an indication that the binary XML data uses at least one client-generated token mapping.

6. A non-transitory computer-readable storage that stores instructions which, when executed by one or more processors, cause the one of more processors to perform:

receiving, at a client, text XML data to be stored as binary XML data in a database managed by a server;

receiving, from the server, translation information for a target namespace, wherein the translation information maps a plurality of strings to a corresponding plurality of binary replacement values;

wherein the translation information includes information that maps a first string of one or more characters of the text XML data to a first binary replacement value;

wherein the translation information includes mappings generated by an entity other than the client;

producing, at the client, an entire set of encoded binary XML data by encoding the text XML data based, at least in part, on the translation information, for the target namespace, received from the server;

wherein producing the binary XML data includes:

beginning the encoding of the text XML data based on the translation information received from the server;

wherein beginning the encoding includes identifying an occurrence of the first string in the text XML data, and encoding the occurrence of the first string with the first binary replacement value;

detecting a second string of one or more characters, in the text XML data, for which no binary replacement value currently exists in the translation information received from the server;

in response to detecting the second string, executing further instructions which cause:

generating a client-generated token mapping for the second string, wherein the client-generated token mapping maps the second string to a second binary replacement value; and encoding the second string based on the client-generated token mapping;

providing, from the client to the server:

the entire set of encoded binary XML data, wherein the entire set of encoded binary XML data is partially encoded according to the client-generated token mapping and partially encoded according to translation information generated by the entity other than the client; and the client-generated token mapping, wherein the client-generated token mapping includes some, but not all, strings and binary replacement values to enable the server to decode the entire set of encoded binary XML data;

wherein the step of producing includes replacing the first string with the first binary replacement value and the second string with the second binary replacement value;

wherein producing the entire set of encoded binary XML data is a first operation of encoding or decoding using the translation information for the target namespace;

maintaining, at the client, a client-side cache that includes a particular cache entry for the target namespace;

wherein the particular cache entry includes the translation information for the target namespace;

in response to generating the client-generated token mapping, setting, as dirty a dirty flag for the particular cache entry that includes the translation information for the target namespace, and not refreshing the particular cache entry until initiating a second operation of encoding or decoding using translation information for the target namespace;
in response to initiating the second operation of encoding or decoding using translation information for the target namespace, the client performing:
checking the client-side cache for the particular cache entry that includes the translation information for the target namespace;
in response to detecting that the client-side cache includes the particular cache entry, determining whether the dirty flag associated with the particular cache entry is set;
in response to detecting that the dirty flag associated with the particular cache entry is set, refreshing the particular cache entry in the client-side cache by requesting a refreshed version of the translation information for the target namespace from the server; and
in response to receiving the refreshed version of the translation information from the server, storing the refreshed version of the translation information in the client-side cache.

7. The non-transitory computer-readable storage of claim 6, wherein the step of checking the client-side cache for the particular cache entry that includes the translation information for the target namespace includes:
determining the target namespace associated with a second set of XML data used in the second operation; and
determining whether the client-side cache includes token mappings for said target namespace.

8. The non-transitory computer-readable storage of claim 6, wherein the server is a database server, and wherein the client is a middleware layer in a communication path between a database client and the database server.

9. The non-transitory computer-readable storage of claim 6, wherein each binary replacement value of the first binary replacement value and the second binary replacement value takes less space to store than a single text character.

10. The non-transitory computer-readable storage of claim 6, that stores instructions, which when executed, further cause: providing, with the entire set of encoded binary XML data and the client-generated token mapping, an indication that the binary XML data uses at least one client-generated token mapping.

11. A method comprising:
using a server to retrieve, from a database, translation information for a target namespace, wherein the translation information maps a plurality of strings to a corresponding plurality of binary replacement values;
wherein the translation information includes translation information that maps a first string of one or more characters of text XML data to a first binary replacement value;
wherein the translation information includes translation information generated by an entity other than a particular client;
sending, from the server to the particular client, the translation information;
receiving, at the server from the particular client:
an entire set of encoded binary XML data, wherein the entire set of binary XML data is partially encoded according to a client-generated token mapping and partially encoded according to the translation information generated by the entity other than the particular client; and
the client-generated token mapping, wherein the client-generated token mapping includes some, but not all, strings and binary replacement values to enable the server to decode the entire set of binary XML data;
wherein the entire set of encoded binary XML data includes the first binary replacement value in place of the first string of one or more characters and a second binary replacement value;
wherein the translation information, as sent from the server, does not include a token mapping for the second binary replacement value;
wherein the client-generated token mapping maps the second binary replacement value to a second string of one or more characters;
using the server to modify, in the database, the translation information for the target namespace by storing the client-generated token mapping as part of the translation information;
wherein the method is performed by one or more computing devices;
wherein the client is one of a plurality of clients to which the server provides the translation information;
wherein the translation information does not include a token mapping for a particular token;
receiving, from two or more of said plurality of clients, conflicting client-generated token mappings for said particular token;
choosing, at the server, one of the conflicting client-generated token mappings; and
remapping, at the server, binary XML data that was generated, by one or more of said plurality of clients, based on one or more client-generated token mappings for the particular token other than the chosen client-generated token mapping for the particular token, wherein the remapped binary XML data uses the chosen client-generated token mapping.

12. The method of claim 11, wherein the server is a database server, and wherein the client is a middleware layer in a communication path between a database client and the database server.

13. The method of claim 11, wherein each binary replacement value of the first binary replacement value and the second binary replacement value takes less space to store than a single text character.

14. The method of claim 11, further comprising: receiving, with the entire set of encoded binary XML data and the client-generated token mapping, an indication that the binary XML data uses at least one client-generated token mapping.

15. A non-transitory computer-readable storage that stores instructions which, when executed by one or more processors, cause the one of more processors to perform:
using a server to retrieve, from a database, translation information for a target namespace, wherein the translation information maps a plurality of strings to a corresponding plurality of binary replacement values;
wherein the translation information includes translation information that maps a first string of one or more characters of text XML data to a first binary replacement value;
wherein the translation information includes translation information generated by an entity other than a particular client;
sending from the server to the particular client, the translation information;
receiving, at the server from the particular client:

an entire set of encoded binary XML data, wherein the entire set of binary XML data is partially encoded according to a client-generated token mapping and partially encoded according to the translation information generated by the entity other than the particular client; and the client-generated token mapping, wherein the client-generated token mapping includes some, but not all, strings and binary replacement values to enable the server to decode the entire set of binary XML data;

wherein the entire set of encoded binary XML data includes the first binary replacement value in place of the first string of one or more characters and a second binary replacement value;

wherein the translation information, as sent from the server, does not include a token mapping for the second binary replacement value;

wherein the client-generated token mapping maps the second binary replacement value to a second string of one or more characters;

after the entire set of binary XML data has been created, using the server to modify, in the database, the translation information for the target namespace by storing the client-generated token mapping as part of the translation information;

wherein:

the client is one of a plurality of clients to which the server provides the translation information;

the translation information does not include a token mapping for a particular token;

receiving, from two or more of said plurality of clients, conflicting client-generated token mappings for said particular token;

choosing, at the server, one of the conflicting client-generated token mappings; and remapping, at the server, binary XML data that was generated, by one or more of said plurality of clients, based on one or more client-generated token mappings for the particular token other than the chosen client-generated token mapping for the particular token, wherein the remapped binary XML data uses the chosen client-generated token mapping.

16. The non-transitory computer-readable storage of claim 15, wherein the server is a database server, and wherein the client is a middleware layer in a communication path between a database client and the database server.

17. The non-transitory computer-readable storage of claim 15, wherein each binary replacement value of the first binary replacement value and the second binary replacement value takes less space to store than a single text character.

18. The non-transitory computer-readable storage of claim 15, that stores instructions, which when executed, further cause: receiving, with the entire set of encoded binary XML data and the client-generated token mapping, an indication that the binary XML data uses at least one client-generated token mapping.

19. A method comprising:

receiving, at a client, text XML, data to be stored as binary XML data in a database managed by a server;

receiving, from the server, translation information for a target namespace, wherein the translation information maps a plurality of strings to a corresponding plurality of binary replacement values;

wherein the translation information includes information that maps a first string of one or more characters of the text XML data to a first binary replacement value;

wherein the translation information includes information generated by an entity other than the client;

producing, at the client, an entire set of encoded binary XML data by encoding the text XML data based, at least in part, on the translation information, for the target namespace, received from the server;

wherein producing the entire set of encoded binary XML data includes:

beginning the encoding of the text XML data based on the translation information received from the server;

wherein beginning the encoding includes identifying an occurrence of the first string in the text XML data, and encoding the occurrence of the first string with the first binary replacement value;

detecting a second string of one or more characters, in the text XML data, for which no binary replacement value currently exists in the translation information received from the server;

in response to detecting the second string, performing the steps of:

generating a client-generated token mapping for the second string, wherein the client-generated token mapping maps the second string to a second binary replacement value; and encoding the second string based on the client-generated token mapping;

providing, from the client to the server:

the entire set of encoded binary XML data, wherein the entire set of encoded binary XML data is partially encoded according to the client-generated token mapping and partially encoded according to translation information generated by the entity other than the client; and the client-generated token mapping, wherein the client-generated token mapping includes some, but not all, strings and binary replacement values to enable the server to decode the entire set of encoded binary XML data;

wherein the step of producing includes replacing the first string with the first binary replacement value and the second string with the second binary replacement value;

wherein the method is performed by one or more computing devices;

receiving, at the client, refreshed mapping information from the server, wherein the refreshed mapping information overrides the client-generated token mapping with a server-selected token mapping generated by a different client, wherein the refreshed mapping information describes how the binary XML data is stored in the database, wherein the refreshed mapping information indicates that the binary XML, data provided by the client has been re-mapped using the server- selected token mapping, and wherein the server-selected token mapping is different than the client-generated token mapping.

20. The method of claim 19, wherein the server is a database server, and wherein the client is a middleware layer in a communication path between a database client and the database server.

21. The method of claim 19, wherein each binary replacement value of the first binary replacement value and the second binary replacement value takes less space to store than a single text character.

22. The method of claim 19, further comprising: providing, with the entire set of encoded binary XML data and the client-generated token mapping, an indication that the binary XML data uses at least one client-generated token mapping.

23. A non-transitory computer-readable storage that stores instructions which, when executed by one or more processors, cause the one of more processors to perform:
receiving, at a client, text XML, data to be stored as binary XML data in a database managed by a server;
receiving, from the server, translation information for a target namespace, wherein the translation information maps a plurality of strings to a corresponding plurality of binary replacement values;
wherein the translation information includes information that maps a first string of one or more characters of the text XML data to a first binary replacement value;
wherein the translation information includes mappings generated by an entity other than the client;
producing, at the client, an entire set of encoded binary XML data by encoding the text XML data based, at least in part, on the translation information, for the target namespace, received from the server;
wherein producing the binary XML data includes:
beginning the encoding of the text XML data based on the translation information received from the server;
wherein beginning the encoding includes identifying an occurrence of the first string in the text XML data, and encoding the occurrence of the first string with the first binary replacement value;
detecting a second string of one or more characters, in the text XML data, for which no binary replacement value currently exists in the translation information received from the server;
in response to detecting the second string, executing further instructions which cause:
generating a client-generated token mapping for the second string, wherein the client-generated token mapping maps the second string to a second binary replacement value; and
encoding the second string based on the client-generated token mapping;
providing, from the client to the server:
the entire set of encoded binary XML data, wherein the entire set of encoded binary XML data is partially encoded according to the client-generated token mapping and partially encoded according to translation information generated by the entity other than the client; and
the client-generated token mapping, wherein the client-generated token mapping includes some, but not all, strings and binary replacement values to enable the server to decode the entire set of encoded binary XML data;
wherein the step of producing includes replacing the first string with the first binary replacement value and the second string with the second binary replacement value;
wherein the instructions further cause the one or more processors to perform receiving, at the client, refreshed mapping information from the server, wherein the refreshed mapping information overrides the client-generated token mapping with a server-selected token mapping generated by a different client, wherein the refreshed mapping information describes how the binary XML data is stored in the database, wherein the refreshed mapping information indicates that the binary XML data provided by the client has been re-mapped using the server-selected token mapping, and wherein the server-selected token mapping is different than the client-generated token mapping.

24. The non-transitory computer-readable storage of claim 23, wherein the server is a database server, and wherein the client is a middleware layer in a communication path between a database client and the database server.

25. The non-transitory computer-readable storage of claim 23, wherein each binary replacement value of the first binary replacement value and the second binary replacement value takes less space to store than a single text character.

26. The non-transitory computer-readable storage of claim 23, that stores instructions, which when executed, further cause: providing, with the entire set of encoded binary XML data and the client-generated token mapping, an indication that the binary XML data uses at least one client-generated token mapping.

* * * * *

UNITED STATES PATENT AND TRADEMARK OFFICE
CERTIFICATE OF CORRECTION

PATENT NO. : 9,953,103 B2
APPLICATION NO. : 11/601118
DATED : April 24, 2018
INVENTOR(S) : Khaladkar et al.

Page 1 of 1

It is certified that error appears in the above-identified patent and that said Letters Patent is hereby corrected as shown below:

On the Title Page

Page 2, Column 2, under Other Publications, Line 33, delete "11/743,561," and insert -- 11/743,563, --, therefor.

In the Claims

In Column 12, Line 29, in Claim 1, delete "XML," and insert -- XML --, therefor.

In Column 17, Line 59, in Claim 19, delete "XML," and insert -- XML --, therefor.

In Column 18, Line 53, in Claim 19, delete "XML," and insert -- XML --, therefor.

In Column 19, Line 7, in Claim 23, delete "XML," and insert -- XML --, therefor.

Signed and Sealed this
Sixth Day of November, 2018

Andrei Iancu
*Director of the United States Patent and Trademark Office*